(12) United States Patent
Fonte

(10) Patent No.: US 9,771,637 B2
(45) Date of Patent: Sep. 26, 2017

(54) COMPOSITE CRUCIBLES AND METHODS OF MAKING AND USING THE SAME

(71) Applicant: ATI PROPERTIES LLC, Albany, OR (US)

(72) Inventor: Matthew V. Fonte, Concord, MA (US)

(73) Assignee: ATI PROPERTIES LLC, Albany, OR (US)

(*) Notice: Subject to any disclaimer, the term of this patent is extended or adjusted under 35 U.S.C. 154(b) by 174 days.

(21) Appl. No.: 14/564,121

(22) Filed: Dec. 9, 2014

(65) Prior Publication Data

US 2016/0160382 A1 Jun. 9, 2016

(51) Int. Cl.
| C30B 9/02 | (2006.01) |
| C22C 27/02 | (2006.01) |
| C30B 35/00 | (2006.01) |
| B32B 15/01 | (2006.01) |
| C22C 27/04 | (2006.01) |

(52) U.S. Cl.
CPC ............. *C22C 27/02* (2013.01); *B32B 15/01* (2013.01); *C22C 27/04* (2013.01); *C30B 35/002* (2013.01)

(58) Field of Classification Search
CPC .................................... C22B 6/02; C30B 9/02
See application file for complete search history.

(56) References Cited

U.S. PATENT DOCUMENTS

| 3,035,341 | A | 5/1962 | Frank et al. |
| 4,859,257 | A | 8/1989 | Bates et al. |
| 5,171,379 | A | 12/1992 | Kumar et al. |
| 6,521,173 | B2 | 2/2003 | Kumar et al. |
| 6,547,877 | B2 | 4/2003 | Vodakov et al. |
| 6,887,356 | B2 | 5/2005 | Ford et al. |
| 7,025,928 | B2 | 4/2006 | Hodjat |
| 7,524,376 | B2 | 4/2009 | Wang |
| 7,601,232 | B2 | 10/2009 | Fonte et al. |
| 7,703,656 | B2 | 4/2010 | Park et al. |
| 2005/0155677 | A1 | 7/2005 | Wickersham |
| 2006/0174826 | A1 | 8/2006 | Helava et al. |
| 2010/0236122 | A1 | 9/2010 | Fonte |
| 2012/0291699 | A1 | 11/2012 | Fonte |

(Continued)

FOREIGN PATENT DOCUMENTS

| JP | 63120126 | * | 6/1988 |
| JP | 01219178 | * | 9/1989 |

OTHER PUBLICATIONS

Wong et al., "Cold rotary forming of thin-wall component from flat-disc blank", Journal of Materials Processing Technology, 208, 2008, 53-62.

(Continued)

*Primary Examiner* — Robert M Kunemund
(74) *Attorney, Agent, or Firm* — K&L Gates LLP

(57) ABSTRACT

A composite crucible for growing single crystals comprises an outer crucible of a first material, and an inner liner of a second material having a coefficient of thermal expansion differing from the first material. The outer crucible comprises an inside bore. The inner liner is disposed in the inside bore without diffusion bonding or chemical bonding between the outer crucible and the inner liner. In certain non-limiting embodiments, the first material is one of molybdenum and a molybdenum alloy, and the second material is one of tantalum, niobium, a tantalum alloy, and a niobium alloy.

77 Claims, 7 Drawing Sheets

(56) References Cited

U.S. PATENT DOCUMENTS

2014/0202379 A1   7/2014   Fonte
2015/0075418 A1   3/2015   Fonte

OTHER PUBLICATIONS

Fujii et al., "Effects of Rolling Procedures on the Development of Annealing Textures in Molybdenum Sheets", Journal of the Less-Common Metals, 97, 1984, pp. 163-171.
Standard Test Methods for Determining Average Grain Size, Designation E 112-96, ASTM International, 2004, pp. 1-26.
Mokhov et al., "Sublimation Growth of AlN Bulk Crystals in Ta Crucibles", Journal of Crystal Growth, 281, Elsevier, Apr. 15, 2005, pp. 93-100.
LaBelle Jr., et al., "Growth of Controlled Profile Crystals from the Melt: Part 1—Sapphire Filaments", Mat. Res. Bull., 1971, vol. 6, Pergamon Press, Inc., pp. 571-581.

\* cited by examiner

COMPOSITE CRUCIBLES AND METHODS OF MAKING AND USING THE SAME

BACKGROUND OF THE TECHNOLOGY

Field of Technology

The present disclosure relates to crucibles and to methods of forming and using crucibles.

Description of the Background of the Technology

Light emitting diodes (LEDs) are ubiquitous in modern society: they are in traffic lights, automobile interiors, backlights in cell phones, and many other applications. The growing popularity of LEDs derives from their many advantages over incandescent and fluorescent lamps including high energy efficiency, long lifetimes, compact size, and shock resistance. Furthermore, LEDs can emit light of a precise color, which is useful for certain applications.

High-power LEDs typically use sapphire single crystals as components and substrates. To grow sapphire single crystals, $Al_2O_3$ (alumina) is melted in a crucible or die. A sapphire seed crystal of desired crystallinity is dipped into the melt and pulled or drawn out, whereupon the $Al_2O_3$ is crystallized into solid sapphire. The shape of the crucible-grown sapphire is generally determined by the geometry of the crucible.

Crucibles for growing sapphire single crystals typically are produced from molybdenum. Certain crucibles for growing sapphire single crystals can measure approximately 43 cm in diameter and approximately 51 cm in depth, with a wall thickness ranging from approximately 1.0 mm to approximately 2.5 mm. A molybdenum crucible having those dimensions would weigh no less than approximately 23 kg.

The cost to fabricate a molybdenum crucible for growing sapphire single crystals can be significant. Molybdenum is brittle at room temperature, which can make fabrication difficult. Mechanical working of molybdenum must be carried out above the ductile-brittle transition temperature of the workpiece, which can be 200° C. (400° F.) to 650° C. (1200° F.), depending on the geometry and thickness of the part being formed. Forming a molybdenum sheet can require several steps of pre-heating and deep drawing may, with intermediate cleaning/annealing and re-lubrication steps between the forming steps to avoid forming cracks. Forming processes such as press brake folding of a sheet or bending of a rod may only be possible after localized pre-heating. Even if proper heat is applied, however, forming molybdenum into the desired shape may be difficult, due to material smearing/galling, undesirable thermal expansion of the tooling, and tool wear/fatigue failure. Accordingly, the present inventor identified a need for crucibles constructed in a way that address limitations of conventional molybdenum crucibles.

SUMMARY

According to one non-limiting aspect of the present disclosure, an embodiment of a composite crucible for growing single crystals is described. The composite crucible comprises: an outer crucible of a first material; and an inner liner of a second material having a coefficient of thermal expansion (CTE) differing from the first material. The outer crucible comprises an inside bore. The inner liner is disposed in the inside bore of the outer crucible. The inner liner is not diffusion bonded or chemically bonded to the outer crucible. In certain embodiments of the composite crucible according to the present disclosure, the outer crucible and the inner liner can expand and contract independent of one another in response to temperature variations. In certain non-limiting embodiments, the first material is one of molybdenum and a molybdenum alloy, and the second material is one of tantalum, niobium, a tantalum alloy, and a niobium alloy.

According to another non-limiting aspect of the present disclosure, a method for forming a composite crucible for growing single crystals is described. The method comprises: providing an outer crucible including an inside bore, wherein the outer crucible comprises a first material selected from molybdenum and a molybdenum alloy; providing a preform blank of a second material selected from tantalum, niobium, a tantalum alloy, and a niobium alloy; flowforming the preform blank at a temperature below the recrystallization temperature of the second material to provide an inner liner sized to fit in the inside bore of the outer crucible; and disposing the inner liner in the inside bore without diffusion bonding or chemically bonding the inner liner to the outer crucible, to provide the composite crucible. In certain embodiments of the method, once assembled to provide the composite crucible, the outer crucible and the inner liner can expand and contract independent of one another in response to temperature variations.

According to another non-limiting aspect of the present disclosure, an embodiment of a method for growing single crystals is described. The method comprises: melting a feed material in a composite crucible to provide a molten composition; and crystallizing at least a portion of the molten composition to form single crystals. The composite crucible comprises: an outer crucible of a first material; and an inner liner of a second material having a coefficient of thermal expansion (CTE) differing from the first material. The outer crucible comprises an inside bore, and the inner liner is disposed in the inside bore of the outer crucible. The inner liner is not diffusion bonded or chemically bonded to the outer crucible. In certain embodiments, the outer crucible and the inner liner can expand and contract independent of one another in response to temperature variations. In certain non-limiting embodiments, the first material is one of molybdenum and a molybdenum alloy, and the second material is one of tantalum, niobium, a tantalum alloy, and a niobium alloy.

BRIEF DESCRIPTION OF THE DRAWINGS

Features and advantages of the crucibles and methods described herein may be better understood by reference to the accompanying drawings in which.

The reader will appreciate the foregoing details, as well as others, upon considering the following detailed description of certain non-limiting embodiments of crucibles and methods according to the present disclosure. The reader also may comprehend certain of such additional details upon using the crucibles and methods described herein.

DETAILED DESCRIPTION OF CERTAIN NON-LIMITING EMBODIMENTS

In the present description of non-limiting embodiments and in the claims, other than in the operating examples or where otherwise indicated, all numbers expressing quantities or characteristics of ingredients and products, processing conditions, and the like are to be understood as being modified in all instances by the term "about." Accordingly, unless indicated to the contrary, any numerical parameters set forth in the following description and the attached claims are approximations that may vary depending upon the desired properties one seeks to obtain in the methods, systems, and article according to the present disclosure. At the very least, and not as an attempt to limit the application of the doctrine of equivalents to the scope of the claims, each numerical parameter should at least be construed in light of the number of reported significant digits and by applying ordinary rounding techniques.

The present disclosure, in part, is directed to a composite or bimetallic crucible having advantageous thermal properties. A "crucible" is a term of art and will be readily understood by those having ordinary skill in the production of single crystals. The specific shape of the crucible may vary depending on the particular single crystals for which the crucible is utilized. Typically, a crucible includes a circular base and a cylindrical or outwardly tapered wall extending from the base. It is to be understood, however, that the term "crucible" as used herein is intended in a generic sense and is not limited to any specific configuration or shape so long as it can serve as a receptacle for melting feed material. Certain non-limiting embodiments of crucibles for growing single crystals according to the present disclosure may have a circular base and a cylindrical wall, measure approximately 43 cm in diameter and approximately 51 cm in depth, and have a wall thickness ranging from approximately 1.0 mm to approximately 2.5 mm.

Figure 1:
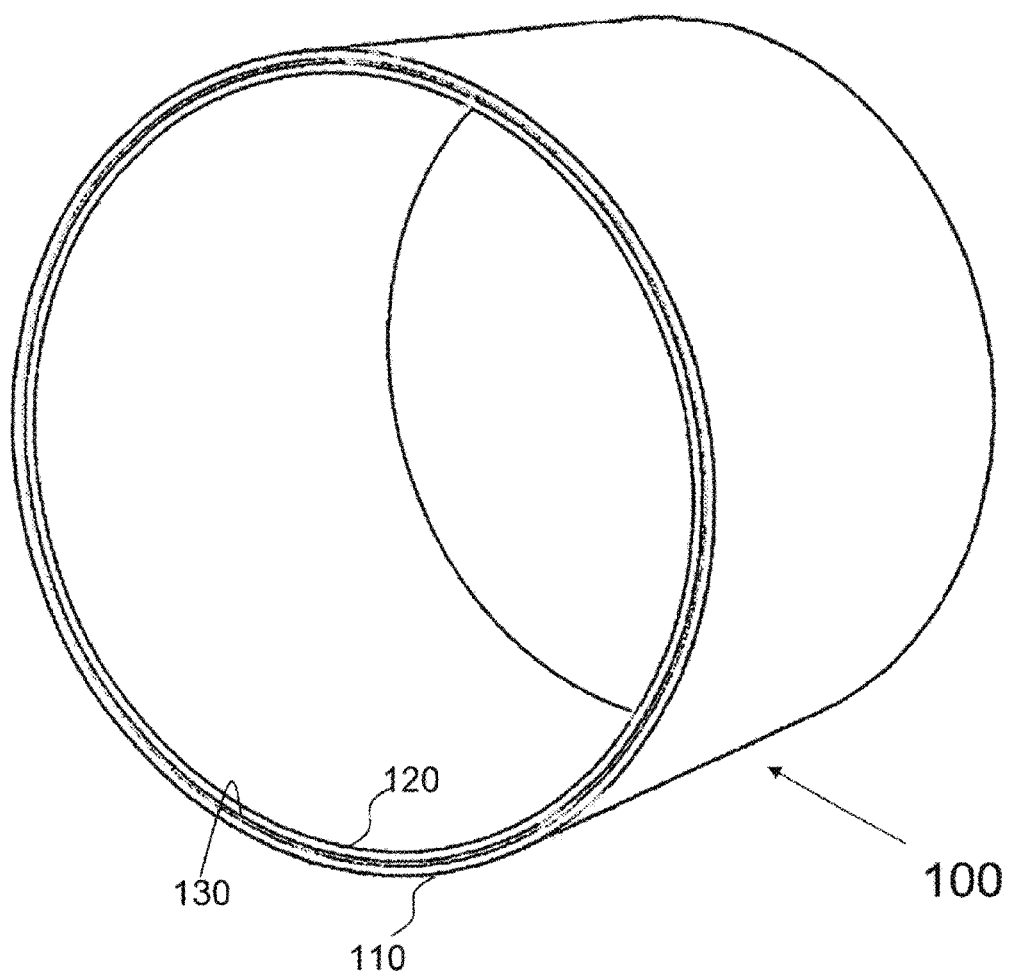
FIG. 1 illustrates one non-limiting embodiment of a composite crucible for growing single crystals according to the present disclosure.

Referring to FIG. 1, the illustrated non-limiting embodiment of a composite crucible 100 comprises an outer crucible 110 of a first material, and an inner liner 120 of a second material having a CTE differing from the first material. The outer crucible comprises an inside bore 130. The outer crucible 110 and the inner liner 120 each include a circular base and a cylindrical wall extending from the perimeter of the base. The inner liner 120 is sized and shaped to fit in the inside bore 130 of the outer crucible 110.

If the first and second materials differ in CTE, yet are bonded together (e.g., by coating, adhesion, cladding, sintering, or hot isostatic pressing), the outer crucible 110 and the inner liner 120 could delaminate from one another, or one or both could crack during heating and cooling. In the composite crucible 100, however, the inner liner 120 is disposed in the inside bore 130 without chemical or diffusion bonding between the outer crucible 110 and the inner liner 120. In this way, the outer crucible 110 and the inner liner 120 may expand and contract independent of one another in response to changing temperature, as further explained below.

According to certain non-limiting embodiments, the outer crucible comprises a first material that is molybdenum or a molybdenum alloy. Molybdenum has one of the highest melting temperatures of all elements, and its CTE is one of the lowest of all engineering metals. In this regard, pure molybdenum has CTE values ranging from $4.9 \times 10^{-6}/°$ C. ($2.7 \times 10^{-6}/°$ F.) to $5.0 \times 10^{-6}/°$ C. ($2.8 \times 10^{-6}/°$ F.). Single crystal growth processes typically require producing a molten composition at high temperatures. For example, a sapphire single crystal growth process includes melting $Al_2O_3$ at temperatures up to approximately 2200° C., and an aluminum nitrate single crystal growth process requires a temperature of approximately 2300° C. The low CTE renders elemental molybdenum suitable as a crucible material for the single crystal growth processes. Molybdenum alloys also may be suitable. For example, a molybdenum alloy including 5%-20% rhenium can be suitable as a crucible material. A molybdenum alloy including 5%-20% rhenium can have an increased ductility and reduced ductile-brittle transition temperature from about 300° C. to about 50° C., making it cold-workable and flowformable at room temperature. Moreover, the room temperature elongation can increase from 8% to 50% by alloying molybdenum with 5%-20% rhenium. Forming an entire crucible from molybdenum or a molybdenum alloy, however, can be costly due to the cost of molybdenum and the significant cost associated with fabricating articles from molybdenum and its alloys.

According to certain non-limiting embodiments, the outer crucible 110 of the composite crucible 100 consists of a first material selected from molybdenum and a molybdenum alloy, and the inner liner 120 consists of a second material differing from the first material. According to certain non-limiting embodiments, the second material is one of tantalum, niobium, a tantalum alloy, and a niobium alloy (e.g., C-103 niobium alloy). One benefit of using an inner liner of tantalum, niobium, a tantalum alloy, and a niobium alloy, rather than molybdenum or a molybdenum alloy, is that certain tantalum alloys and niobium alloys can be cheaper than molybdenum and certain molybdenum alloys. Moreover, tantalum, niobium, and their alloys can improve manufacturability because these materials can be suitable for cold working such as deep drawing, spinning, hydroforming, bulge forming, flowforming, superplastic forming, roll and welding, fabricating, and cold working processes combining one or more of these techniques. In various non-limiting embodiments of composite crucible 110, the inner liner 120 may have a thin wall and a relatively large length-to-diameter ratio, and in such embodiments the inner liner 120 may advantageously be produced from a preform blank using deep-drawing and/or flowforming.

Figure 2:
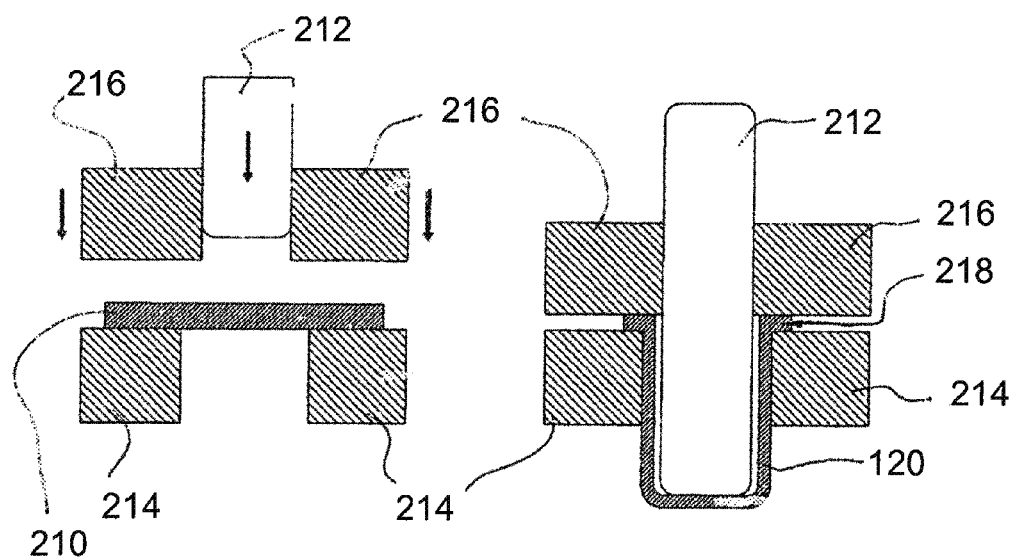
FIG. 2 illustrates one non-limiting embodiment of a deep drawing process that may be used to form components of non-limiting embodiments of a composite crucible according to the present disclosure.

FIG. 2 schematically depicts a deep drawing operation that can be used to form components of various embodiments of a composite crucible according to the present disclosure. As known in the art, deep drawing is a sheet metal forming process in which a sheet metal blank is radially drawn into a forming die by the mechanical action of a punch. It is thus a shape transformation process with material retention. The process is considered "deep" drawing when the depth of the drawn part exceeds its diameter. This is achieved by redrawing the part through a series of dies. The flange region (sheet metal in the die shoulder area) experiences a radial drawing stress and a tangential compressive stress due to the material retention property. These compressive stresses (hoop stresses) can result in flange wrinkles, but wrinkles can be prevented by using a blank holder, the function of which is to facilitate controlled material flow into the die radius. FIG. 2 illustrates one non-limiting embodiment of a deep draw process for making the inner liner 120 of the composite crucible 100, starting from a sheet/disc blank 210 and forming into the desired "bowl" shape using a punch 212 and die 214. The blank holder 216 helps to prevent of the flange 218 from wrinkling during drawing of the deep drawn article.

Figure 3:
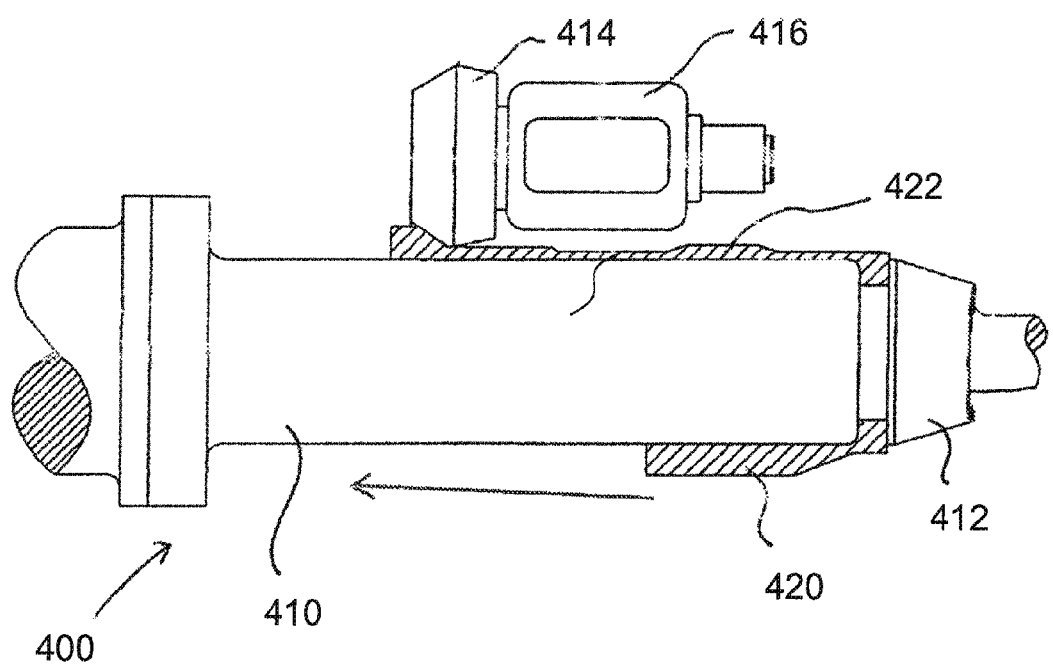
FIG. 3 illustrates one non-limiting embodiment of a flowforming process that may be used to form components of non-limiting embodiments of a composite crucible according to the present disclosure.

FIG. 3 schematically depicts a flowforming operation that can be used to form components of various embodiments of a composite crucible according to the present disclosure. As known to those having ordinary skill, flowforming is a net-shape cold metal forming process used to manufacture precise, tubular components that have large length-to-diameter ratios. A cylindrical work piece, referred to as a "preform," is fitted over a rotating mandrel. Compression is applied by hydraulically driven, CNC-controlled rollers to the outside diameter of the preform. The desired geometry is achieved when the preform is compressed above its yield strength and plastically deformed and made to flow. As the preform's wall thickness is reduced by the rollers, the material is lengthened and formed over the rotating mandrel. Flowforming is done with the workpiece "cold." Although adiabatic heat is generated from the plastic deformation, heat is dissipated with a refrigerated coolant. This ensures that the material is always worked well below its recrystallization temperature. Because flowforming is conducted on a "cold" workpiece, the material's strength and hardness can be increased and dimensional accuracies can be achieved consistently. In contrast, if flowforming were performed on a workpiece at a temperature above the recrystallization temperature of the material, neither the dimensional accuracies nor the grain growth could be accurately controlled. Flowforming apparatus 400 includes a rotating mandrel 410, a tailstock 412, and a hydraulically driven roller 414 that is fed in the direction of the arrow from roller housing 416. The preform 420 is flowformed over the mandrel 410 to form a region of the flowformed component 422. For example, a preform may be flowformed on the apparatus into a portion of the inner liner 120 of composite crucible 100.

Figure 4:
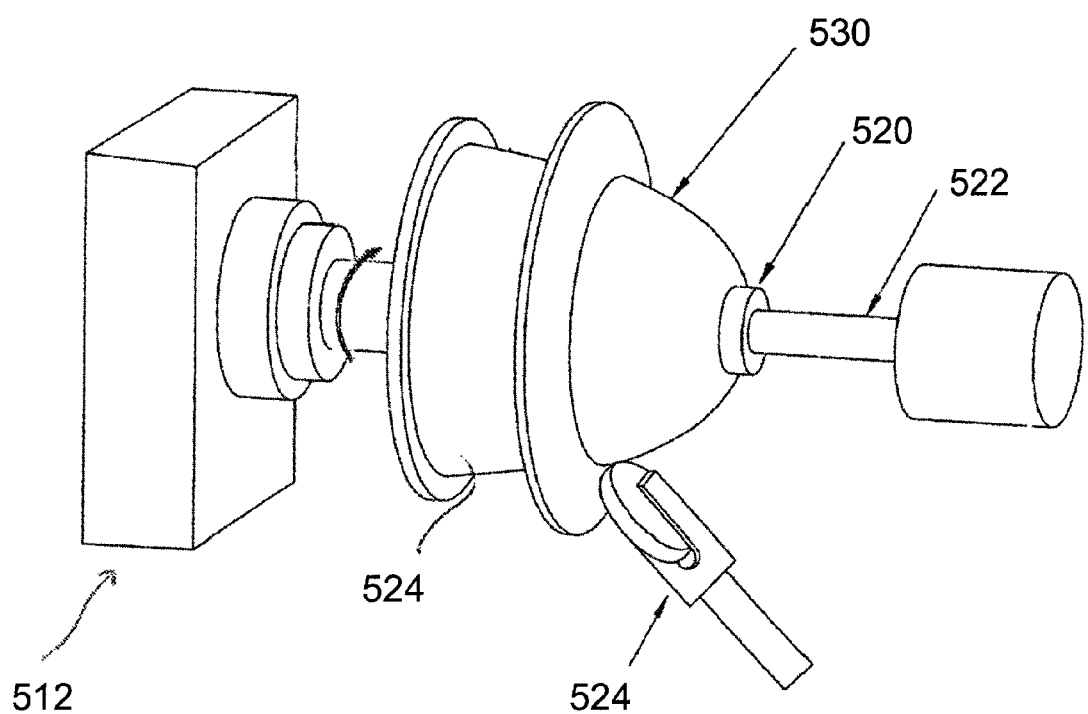
FIG. 4 illustrates one non-limiting embodiment of a spinning process that may be used to form components of non-limiting embodiments of a composite crucible according to the present disclosure.

FIG. 4 schematically depicts a spinning operation that can be used to form components of various embodiments of a composite crucible according to the present disclosure. In the spinning operation depicted in FIG. 4, a mandrel 510, also known as a form, is mounted in the drive section of a lathe 512. A clamp 520 is attached to the tailstock 522, and applies pressure to the workpiece against the mandrel 510. The mandrel and workpiece are then rotated together at high speeds. A localized force is then applied to the workpiece to cause it to flow over the mandrel 510 to form a part 530 having the shape of the mandrel 510. The force is usually applied via various levered tools, such as a roller tool 524. Because the final diameter of the workpiece is always less than the starting diameter, the workpiece must thicken, elongated radially, or buckle circumferentially. The spinning operation may employ a suitably shaped mandrel to form a component of a composite crucible according to the present disclosure.

Figure 5:
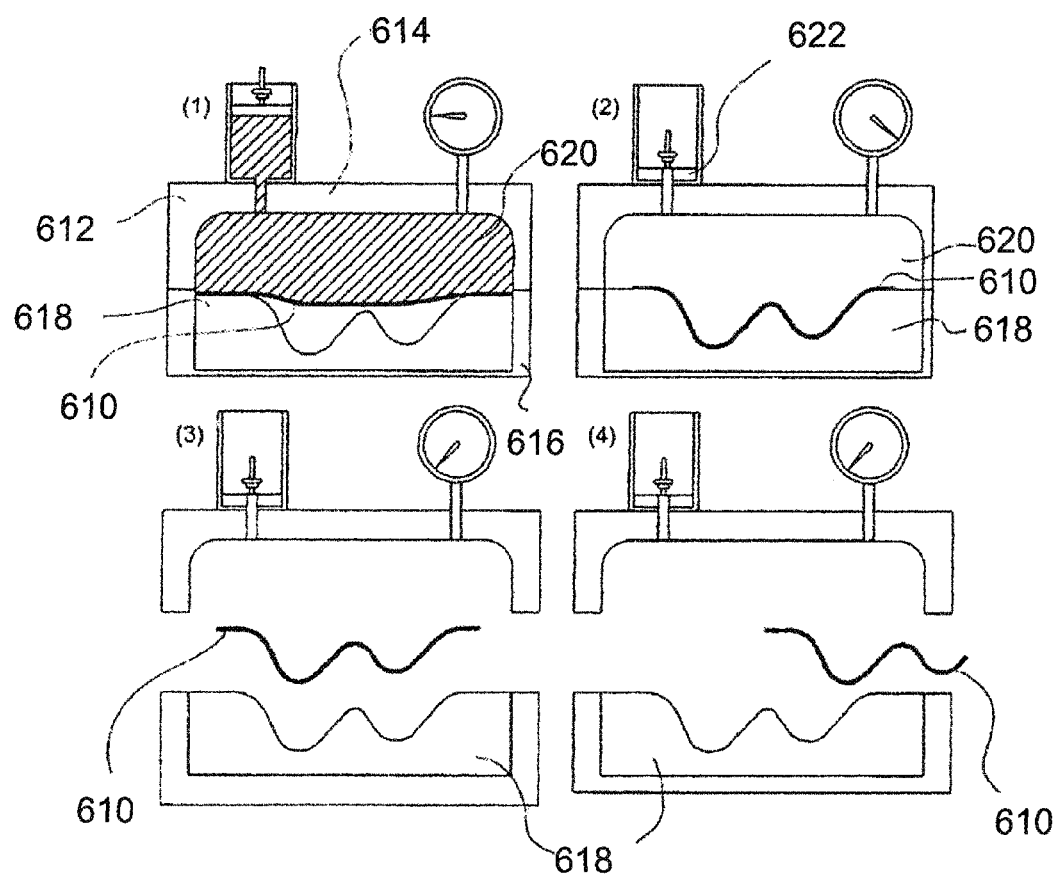
FIG. 5 illustrates one non-limiting embodiment of a hydroforming process that may be used to form components of non-limiting embodiments of a composite crucible according to the present disclosure.

FIG. 5 schematically depicts a hydroforming operation that can be used to form components of various embodiments of a composite crucible according to the present disclosure. As is known to those having ordinary skill, hydroforming is a specialized type of die forming that uses a high pressure hydraulic fluid to press room temperature working material into a die. For example, with reference to FIG. 5, in FIG. 5(1), a sheet 610 of a metallic material is disposed in a chamber 612 including an upper portion 614 and a lower portion 616. The lower portion includes a die 618 having the desired shape of the component to be formed. A liquid 620 fills the upper portion 614 and is in contact with the sheet 610. In FIG. 5(2), piston 622 is activated to pressurize the liquid 620 and force the sheet into die 618 and assume the shape of the die. In FIGS. 5(3) and 5(4), after the liquid is de-pressurized, the upper portion 614 and the lower portion 616 are separated, and the hydroformed component 610 may be removed from the die 618. The hydroforming operation may employ a suitably shaped die to form a component of a composite crucible according to the present disclosure.

With reference again to FIG. 1, according to certain non-limiting embodiments, the inner liner 120 may be retained in the inside bore 130 of the outer crucible 110 by an interference fit. In other non-limiting embodiments, the inner liner 120 may be retained in the inside bore 130 of the outer crucible 110 by any means so long as there is no diffusion bond or chemical bond between the outer crucible 110 and the inner liner 120. Examples of processes that would create a diffusion bond between the outer crucible and the inner liner include, for example, diffusion welding and diffusion brazing. Examples of processes that would create a chemical bond between the outer crucible and the inner liner include, for example, coating, adhesion, cladding, sintering, and hot isostatic pressing. In certain other non-limiting embodiments of a composite crucible according to the present disclosure, the inner liner is simply disposed in the outer crucible and is not retained in the outer crucible in any way. The lack of a diffusion bond or chemical bond between the outer crucible and the inner liner allows the two components to expand and contract independent of each other in response to temperature changes. Therefore, the outer crucible and the inner liner are less likely to delaminate or crack as the composite crucible expands and contracts as it is heated and cools.

According to certain non-limiting embodiments, the second material from which the inner liner is comprised has an ASTM grain size of 7-14. In further non-limiting embodiments, the second material has a grain size of 10-14. Pure molybdenum typically has an ASTM grain size of 1-3, which increases as the temperature increases, such as when a molybdenum crucible is heated to 1700-2400° C. during the production of crystals in the molybdenum crucible, resulting in crystal growth. Grain growth with increasing temperature is undesirable in a crucible for crystal production, because the crucible may become dimensionally unstable, structurally weaker, and more susceptible to embrittlement. In a composite crucible according to the present disclosure, however, the inner liner of the composite crucible comprises niobium, tantalum, or an alloy of niobium or tantalum, having a grain size much smaller than molybdenum, for example an ASTM grain size of 7-14. Moreover, a tantalum alloy or a niobium alloy used as the second material may comprise at least one of silicon and thorium, which can facilitate grain pinning and thereby inhibit grain growth at high temperatures. In certain non-limiting embodiments, the second material is a niobium or tantalum alloy comprising at least one of greater than zero up to 700 ppm silicon and greater than zero up to 500 ppm thorium.

According to certain non-limiting embodiments of a composite crucible according to the present disclosure, the inner liner is carburized prior to use. For example, the inner liner is carburized by heating the inner liner at a temperature from 2200° C. to 2500° C. in a carbon-containing atmosphere. During this heat treatment, the weight of the inner liner gradually increases due to the incorporation of carbon in the second material. If the second material is tantalum, for example, a three-layer structure of Ta/C—Ta—Ta/C initially forms in the inner liner walls during this carburizing treatment. Without intending to be bound to any theory, the central layer may gradually disappear as the crucible becomes saturated with carbon, due to the interaction of tantalum with carbon that may be transported from the carbon-containing vapor by diffusion through small pores in the external Ta/C layers. The carburization treatment can be continued until the component is saturated, at which time the component's weight stops increasing. It can take, for example, 30-40 hours to saturate a particular component with carbon in a carburizing treatment.

According to certain non-limiting embodiments, the inner liner of a composite crucible according to the present disclosure comprises a tantalum alloy or a niobium alloy comprising silicon. Carburizing an inner liner comprising a tantalum or niobium alloy including silicon can create Ta—Si—C or Nb—Si—C, which can inhibit or prevent the inner liner from absorbing SiC vapors during the single crystal growth process. That is, the inner liner can be sealed off from absorbing SiC during the crystal growth process. Embodiments of composite crucible including an inner liner that is a silicon-containing niobium alloy or tantalum alloy may be easy to form, chemically inert, and dimensionally stable, and experience substantially no grain growth at elevated temperatures. As a result, such a composite crucible may be used for a substantial period of time and may even be used for multiple single crystal growth operations. In contrast, conventional molybdenum crucibles typically can be used only a single time.

Figure 6:
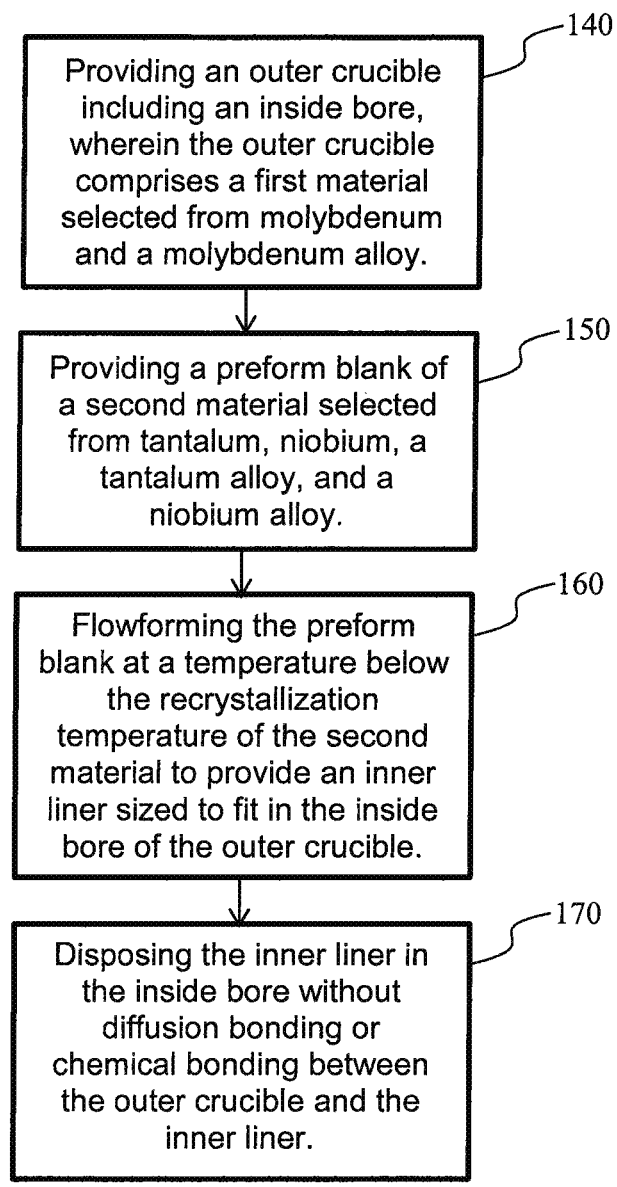
FIG. 6 is a flow diagram of a non-limiting embodiment of a method for making a composite crucible according to the present disclosure.

FIG. 6 is a flow diagram of one non-limiting embodiment of a method for making an embodiment of a composite crucible for growing single crystals according to the present disclosure. Referring to FIG. 6, an outer crucible is provided including an inside bore and comprises a first material that is molybdenum or a molybdenum alloy (block 140). The outer crucible may be made using any suitable manufacturing technique. A preform blank of a second material selected from tantalum, niobium, a tantalum alloy, and a niobium alloy is provided (block 150). The preform blank is flow-formed into an inner liner at a temperature below the recrystallization temperature of the second material (block 160). The inner liner is shaped and sized to fit in the inner bore of the outer crucible. The flowforming operation can limit the grain size of the second material, which can improve thermal stability at the high temperatures used during crystal production. In certain non-limiting embodiments of the method, after flowforming the preform blank to provide the appropriately sized and shaped inner liner, the inner liner is carburized prior to use. In this regard, flowforming can facilitate an even diffusion of carbon during the carburization. The inner liner is disposed in the inside bore (block 170), without diffusion bonding or chemical bonding between the outer crucible and the inner liner, thereby allowing the inner liner and the outer crucible to expand and contract independent of one another in response to temperature changes, without cracking due to CTE differences between the first and second materials.

Figure 7:
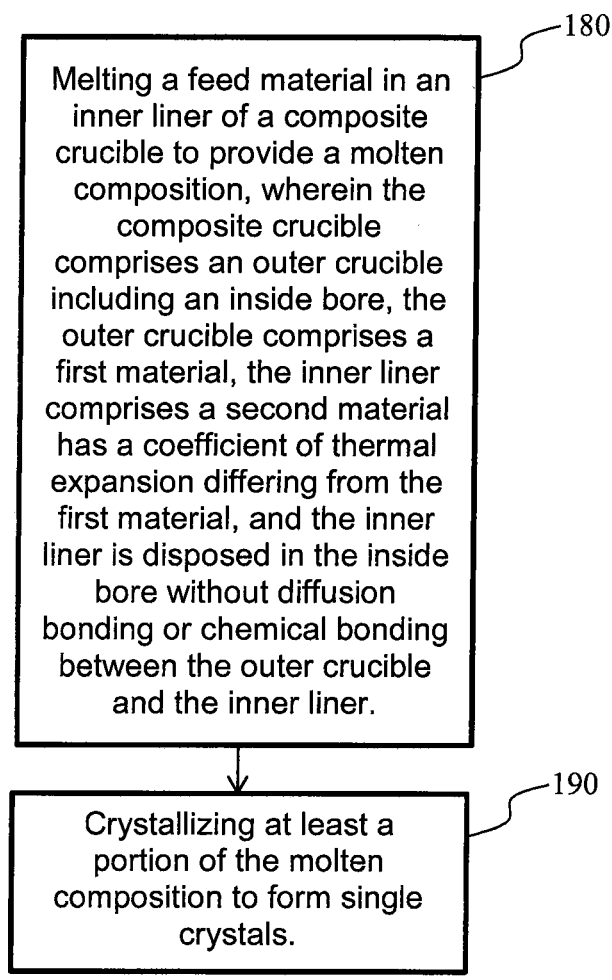
FIG. 7 is a flow diagram of a non-limiting embodiment of a method according to the present disclosure for growing single crystals.

FIG. 7 is a flow diagram of a non-limiting embodiment of a method for growing single crystals. Referring to FIG. 7, a feed material is melted in the inner liner of a composite crucible according to the present disclosure, thereby producing a molten composition in the inner liner (block 180). The composite crucible comprises an outer crucible including an inside bore. The outer crucible comprises a first material selected from molybdenum and a molybdenum alloy, and the inner liner comprises a second material having a coefficient of thermal expansion differing from the first material. The inner liner is disposed in the inside bore, without diffusion bonding or chemical bonding between the outer crucible and the inner liner. At least a portion of the molten composition is crystallized to form single crystals (block 190). According to certain non-limiting embodiments, the single crystals are selected from sapphire crystals, aluminum nitrate, silicon, and ruby crystals. Although the present description references certain single crystals specifically, the crucibles and methods described herein are not limited in this regard. As will be understood, the feed materials may be selected so as to provide crystals having the desired composition and other desired properties.

Although the foregoing description has necessarily presented only a limited number of embodiments, those of ordinary skill in the relevant art will appreciate that various changes in the crucibles and methods, and other details of the examples that have been described and illustrated herein may be made by those skilled in the art, and all such modifications will remain within the principle and scope of the present disclosure as expressed herein and in the appended claims. It is understood, therefore, that the present invention is not limited to the particular embodiments disclosed or incorporated herein, but is intended to cover modifications that are within the principle and scope of the invention, as defined by the claims. It will also be appreciated by those skilled in the art that changes could be made to the embodiments above without departing from the broad inventive concept thereof.

What is claimed is:

1. A composite crucible for growing single crystals, the composite crucible comprising:
    an outer crucible of a first material, the outer crucible comprising an inside bore; and
    an inner liner of a second material having an ASTM drain size of 7 to 14, and a coefficient of thermal expansion differing from the first material, the inner liner disposed in the inside bore without diffusion bonding or chemical bonding between the outer crucible and the inner liner.

2. The composite crucible of claim 1, wherein the first material is one of molybdenum and a molybdenum alloy.

3. The composite crucible of claim 1, wherein the second material is one of tantalum, niobium, a tantalum alloy, and a niobium alloy.

4. The composite crucible of claim 1, wherein the second material is C-103 niobium alloy.

5. The composite crucible of claim 1, wherein the inner liner is retained in the inside bore of the outer crucible by an interference fit.

6. The composite crucible of claim 1, wherein the outer crucible and the inner crucible can expand and contract independent of one another in response to changes in temperature.

7. The composite crucible of claim 1, wherein the outer crucible has a thickness greater than the inner liner.

8. The composite crucible of claim 1, wherein the second material has an ASTM grain size of 10 to 14.

9. The composite crucible of claim 1, wherein the second material is one of a tantalum alloy and a niobium alloy, and wherein the second material comprises at least one of silicon and thorium.

10. The composite crucible of claim 1, wherein the second material is one of a tantalum alloy and a niobium alloy, and wherein the second material comprises greater than 0 up to 700 ppm silicon.

11. The composite crucible of claim 1, wherein the second material is one of a tantalum alloy and a niobium alloy, and wherein the second material comprises greater than 0 up to 500 ppm thorium.

12. The composite crucible of claim 1, wherein the inner liner is carburized prior to use.

13. The composite crucible of claim 12, wherein the inner liner is carburized by heating the inner liner in a carbon-containing atmosphere.

14. The composite crucible of claim 12, wherein the inner liner is carburized at a temperature of 2200° C. to 2500° C.

15. A method for forming a composite crucible for growing single crystals, the method comprising:
providing an outer crucible including an inside bore, wherein the outer crucible comprises a first material selected from molybdenum and a molybdenum alloy;
providing a preform blank of a second material selected from tantalum, niobium, a tantalum alloy, and a niobium alloy;
flowforming the preform blank at a temperature below the recrystallization temperature of the second material to provide an inner liner sized to fit in the inside bore of the outer crucible; and
disposing the inner liner in the inside bore without diffusion bonding or chemical bonding between the outer crucible and the inner liner.

16. The method of claim 15, wherein the second material is C-103 niobium alloy.

17. The method of claim 15, wherein the second material is one of a tantalum alloy and a niobium alloy, and wherein the second material further comprises at least one of silicon and thorium.

18. The method of claim 15, wherein the second material is one of a tantalum alloy and a niobium alloy, and wherein the second material comprises greater than 0 up to 700 ppm silicon.

19. The method of claim 15, wherein the second material is one of a tantalum alloy and a niobium alloy, and wherein the second material comprises greater than 0 up to 500 ppm thorium.

20. The method of claim 15, further comprising, after flowforming the preform blank to provide the inner liner, carburizing the inner liner prior to use.

21. The method of claim 20, wherein carburizing the inner liner comprises heating the inner liner in a carbon-containing atmosphere.

22. The method of claim 20, wherein carburizing the inner liner comprises carburizing the inner liner at a temperature of 2200° C. to 2500° C.

23. The method of claim 15, wherein the second material has an ASTM grain size of 7 to 14.

24. The method of claim 15, wherein the second material has an ASTM grain size of 10 to 14.

25. A method for growing single crystals, the method comprising:
melting a feed material in an inner liner of a composite crucible to provide a molten composition, wherein the composite crucible comprises an outer crucible including an inside bore, the outer crucible comprises a first material, the inner liner comprises a second material having an ASTM grain size of 7 to 14, and a coefficient of thermal expansion differing from the first material, and the inner liner is disposed in the inside bore without diffusion bonding or chemical bonding between the outer crucible and the inner liner; and
crystallizing at least a portion of the molten composition to form single crystals.

26. The method of claim 25, wherein the first material is one of molybdenum and a molybdenum alloy.

27. The method of claim 25, wherein the second material is one of tantalum, niobium, a tantalum alloy, and a niobium alloy.

28. The method of claim 25, wherein the second material is C-103 niobium alloy.

29. The method of claim 25, wherein the inner liner is retained in the inside bore of the outer crucible by an interference fit.

30. The method of claim 25, wherein the outer crucible has a thickness greater than the inner liner.

31. The method of claim 25, wherein the second material is one of a tantalum alloy and a niobium alloy, and wherein the second material comprises at least one of silicon and thorium.

32. The method of claim 25, wherein the second material is one of a tantalum alloy and a niobium alloy, and wherein the second material comprises greater than zero up to 700 ppm silicon.

33. The method of claim 25, wherein the second material is one of a tantalum alloy and a niobium alloy, and wherein the second material comprises greater than 0 up to 500 ppm thorium.

34. The method of claim 25, wherein the inner liner is a flowformed inner liner.

35. The method of claim 25, wherein the inner liner is a carburized inner liner.

36. The method of claim 25, wherein the inner liner is a carburized flowformed inner liner.

37. The method of claim 25, wherein the second material has an ASTM grain size of 10 to 14.

38. The method of claim 25, wherein the single crystals are selected from sapphire crystals, aluminum nitrate, silicon, and ruby crystals.

39. A composite crucible for growing single crystals, the composite crucible comprising:
an outer crucible of a first material comprising an inside bore; and
an inner liner of a second material having a coefficient of thermal expansion differing from the first material, the inner liner disposed in the inside bore without diffusion bonding or chemical bonding between the outer crucible and the inner liner, wherein the second material is one of tantalum, niobium, a tantalum alloy, and a niobium alloy.

40. The composite crucible of claim 39, wherein the first material is selected from molybdenum and a molybdenum alloy.

41. The composite crucible of claim 39, wherein the inner liner is retained in the inside bore of the outer crucible by an interference fit.

42. The composite crucible of claim 39, wherein the outer crucible and the inner crucible can expand and contract independent of one another in response to changes in temperature.

43. The composite crucible of claim 39, wherein the second material has an ASTM grain size of 10 to 14.

44. The composite crucible of claim 39, wherein the second material is one of a tantalum alloy and a niobium alloy, and wherein the second material comprises greater than 0 up to 700 ppm silicon.

45. The composite crucible of claim 39, wherein the inner liner is carburized prior to use.

46. A composite crucible for growing single crystals, the composite crucible comprising:
an outer crucible of a first material, the outer crucible comprising an inside bore; and
an inner liner of a second material having a coefficient of thermal expansion differing from the first material, the inner liner disposed in the inside bore without diffusion bonding or chemical bonding between the outer crucible and the inner liner;
wherein the second material is one of a tantalum alloy and a niobium alloy, and wherein the second material comprises at least one of silicon and thorium.

47. The composite crucible of claim 46, wherein the first material is one of molybdenum and a molybdenum alloy.

48. The composite crucible of claim 46, wherein the inner liner is retained in the inside bore of the outer crucible by an interference fit.

49. The composite crucible of claim 46, wherein the outer crucible and the inner crucible can expand and contract independent of one another in response to changes in temperature.

50. The composite crucible of claim 46, wherein the second material has an ASTM grain size of 10 to 14.

51. The composite crucible of claim 46, wherein the second material comprises greater than 0 up to 700 ppm silicon.

52. The composite crucible of claim 46, wherein the second material comprises greater than 0 up to 500 ppm thorium.

53. The composite crucible of claim 46, wherein the inner liner is carburized prior to use.

54. A composite crucible for growing single crystals, the composite crucible comprising:
an outer crucible of a first material, the outer crucible comprising an inside bore; and
an inner liner of a second material having a coefficient of thermal expansion differing from the first material, the inner liner disposed in the inside bore without diffusion bonding or chemical bonding between the outer crucible and the inner liner, wherein the inner liner is carburized prior to use.

55. The composite crucible of claim 54, wherein the second material is one of tantalum, niobium, a tantalum alloy, and a niobium alloy.

56. The composite crucible of claim 54, wherein the inner liner is retained in the inside bore of the outer crucible by an interference fit.

57. The composite crucible of claim 54, wherein the outer crucible and the inner crucible can expand and contract independent of one another in response to changes in temperature.

58. The composite crucible of claim 54, wherein the second material has an ASTM grain size of 10 to 14.

59. The composite crucible of claim 54, wherein the second material is one of a tantalum alloy and a niobium alloy, and wherein the second material comprises at least one of silicon and thorium.

60. The composite crucible of claim 54, wherein the second material is one of a tantalum alloy and a niobium alloy, and wherein the second material comprises greater than 0 up to 700 ppm silicon.

61. A method for growing single crystals, the method comprising:
melting a feed material in an inner liner of a composite crucible to provide a molten composition, wherein the composite crucible comprises an outer crucible including an inside bore, the outer crucible comprises a first material, the inner liner comprises a second material having a coefficient of thermal expansion differing from the first material, and the inner liner is disposed in the inside bore without diffusion bonding or chemical bonding between the outer crucible and the inner liner; and
crystallizing at least a portion of the molten composition to form single crystals;
wherein the second material is one of tantalum, niobium, a tantalum alloy, and a niobium alloy.

62. The method of claim 61, wherein the first material is one of molybdenum and a molybdenum alloy.

63. The method of claim 61, wherein the inner liner is retained in the inside bore of the outer crucible by an interference fit.

64. The method of claim 61, wherein the second material is one of a tantalum alloy and a niobium alloy, and wherein the second material comprises at least one of silicon and thorium.

65. The method of claim 61, wherein the second material is one of a tantalum alloy and a niobium alloy, and wherein the second material comprises greater than zero up to 700 ppm silicon.

66. The method of claim 61, wherein the inner liner is a flowformed inner liner.

67. The method of claim 61, wherein the inner liner is a carburized inner liner.

68. The method of claim 61, wherein the inner liner is a carburized flowformed inner liner.

69. The method of claim 61, wherein the second material has an ASTM grain size of 10 to 14.

70. The method of claim 25, wherein the single crystals are selected from sapphire, aluminum nitrate, silicon, and ruby.

71. A method for growing single crystals, the method comprising:
melting a feed material in an inner liner of a composite crucible to provide a molten composition, wherein the composite crucible comprises an outer crucible including an inside bore, the outer crucible comprises a first material, the inner liner comprises a second material has a coefficient of thermal expansion differing from the first material, and the inner liner is disposed in the inside bore without diffusion bonding or chemical bonding between the outer crucible and the inner liner; and
crystallizing at least a portion of the molten composition to form single crystals;
wherein the second material is one of a tantalum alloy and a niobium alloy, and wherein the second material comprises at least one of silicon and thorium.

72. The method of claim 71, wherein the first material is one of molybdenum and a molybdenum alloy.

73. The method of claim 71, wherein the inner liner is retained in the inside bore of the outer crucible by an interference fit.

74. The method of claim 71, wherein the second material is one of a tantalum alloy and a niobium alloy, and wherein the second material comprises greater than zero up to 700 ppm silicon.

75. The method of claim 71, wherein the inner liner is a flowformed inner liner.

76. The method of claim 71, wherein the second material has an ASTM grain size of 10 to 14.

77. The method of claim 25, wherein the single crystals are selected from sapphire, aluminum nitrate, silicon, and ruby.

* * * * *